US008796717B2

(12) United States Patent
Shin

(10) Patent No.: US 8,796,717 B2
(45) Date of Patent: Aug. 5, 2014

(54) LIGHT-EMITTING DIODE PACKAGE AND MANUFACTURING METHOD THEREOF

(75) Inventor: Kyung Ho Shin, Gwangju (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 13/495,664

(22) Filed: Jun. 13, 2012

(65) Prior Publication Data

US 2012/0248488 A1 Oct. 4, 2012

Related U.S. Application Data

(63) Continuation of application No. 12/788,090, filed on May 26, 2010, now Pat. No. 8,212,274, which is a continuation of application No. 11/910,174, filed as application No. PCT/KR2007/001020 on Feb. 28, 2007, now Pat. No. 7,745,844.

(30) Foreign Application Priority Data

Mar. 3, 2006 (KR) .................. 10-2006-0020305

(51) Int. Cl.
*H01L 33/60* (2010.01)
*H01L 33/64* (2010.01)
*H01L 33/48* (2010.01)

(52) U.S. Cl.
CPC ............ *H01L 33/642* (2013.01); *H01L 33/486* (2013.01); *H01L 33/60* (2013.01); *H01L 33/64* (2013.01); *H01L 33/644* (2013.01); *H01L 2924/00014* (2013.01)
USPC .......................... 257/98; 257/99; 257/E33.075

(58) Field of Classification Search
CPC ...... H01L 33/64; H01L 33/642; H01L 33/644
USPC ....................... 257/98, 99, E33.075
See application file for complete search history.

(56) References Cited

U.S. PATENT DOCUMENTS

| 5,739,554 | A  | 4/1998 | Edmond et al. |
| 6,756,610 | B2 | 6/2004 | Sakamoto et al. |
| 6,864,567 | B2 | 3/2005 | Yu |
| 6,877,914 | B2 | 4/2005 | Okada et al. |
| 6,949,770 | B2 | 9/2005 | Yamaguchi et al. |
| 6,983,086 | B2 | 1/2006 | Fardi et al. |
| 7,021,799 | B2 | 4/2006 | Mizuyoshi |

(Continued)

FOREIGN PATENT DOCUMENTS

| CN | 1708212 A | 12/2005 |
| JP | 60-028366 U | 2/1985 |

(Continued)

OTHER PUBLICATIONS

Office Action dated Dec. 20, 2011 in Japanese Application No. 2008-557208, filed Feb. 28, 2007.

(Continued)

*Primary Examiner* — Long K Tran
*Assistant Examiner* — Jordan Klein
(74) *Attorney, Agent, or Firm* — Saliwanchik, Lloyd & Eisenschenk

(57) ABSTRACT

An LED package is provided. The LED package comprises a metal plate, circuit patterns, and an LED. The metal plate comprises grooves. The insulating layer is formed on the metal plate. The circuit patterns are formed on the insulating layer. The LED is electrically connected with the circuit pattern on the insulating layer.

20 Claims, 3 Drawing Sheets

(56) References Cited

U.S. PATENT DOCUMENTS

| | | |
|---|---|---|
| 7,116,854 B2 | 10/2006 | Kaneko et al. |
| 7,151,313 B2 | 12/2006 | Kondo |
| 7,335,522 B2 | 2/2008 | Wang et al. |
| 7,335,926 B2 | 2/2008 | Wang et al. |
| 7,420,271 B2 | 9/2008 | Hsu |
| 7,452,110 B2 | 11/2008 | Chen |
| 7,495,322 B2 | 2/2009 | Hashimoto et al. |
| 7,612,385 B2 | 11/2009 | Kim et al. |
| 7,745,832 B2 | 6/2010 | Hsieh et al. |
| 2002/0024287 A1* | 2/2002 | Miura et al. ............ 313/422 |
| 2002/0047187 A1 | 4/2002 | Nakajima et al. |
| 2004/0099874 A1 | 5/2004 | Chang et al. |
| 2004/0188699 A1 | 9/2004 | Kameyama et al. |
| 2004/0222516 A1 | 11/2004 | Lin et al. |
| 2005/0077616 A1 | 4/2005 | Ng et al. |
| 2005/0199899 A1 | 9/2005 | Lin et al. |
| 2006/0097385 A1* | 5/2006 | Negley ................... 257/722 |
| 2006/0124953 A1 | 6/2006 | Negley et al. |
| 2006/0138645 A1 | 6/2006 | Ng et al. |
| 2006/0208271 A1 | 9/2006 | Kim et al. |
| 2008/0175003 A1 | 7/2008 | Tsou et al. |

FOREIGN PATENT DOCUMENTS

| | | |
|---|---|---|
| JP | 63-024857 U | 2/1988 |
| JP | 06-077540 A | 3/1994 |
| JP | 08-204294 A | 8/1996 |
| JP | 10-144963 A | 5/1998 |
| JP | 11-284110 A | 10/1999 |
| JP | 2001-057406 A | 2/2001 |
| JP | 2001-148512 A | 5/2001 |
| JP | 2002-083913 A | 3/2002 |
| JP | 2003-304000 A | 10/2003 |
| JP | 2004-055632 A | 2/2004 |
| JP | 2005-116990 A | 4/2005 |
| JP | 2007-100209 A | 4/2007 |
| KR | 10-0455089 | 11/2004 |
| KR | 10-2005-0031705 | 4/2005 |
| WO | WO-2004/107461 A1 | 12/2004 |
| WO | WO-2006/046981 A2 | 5/2006 |

OTHER PUBLICATIONS

Notice of Allowance dated Nov. 19, 2012 in Korean Application No. 10-2006-0020305, filed Mar. 3, 2006.

Office Action dated Jul. 23, 2013 in Japanese Application No. 2012-095306, filed Apr. 19, 2012.

* cited by examiner

LIGHT-EMITTING DIODE PACKAGE AND MANUFACTURING METHOD THEREOF

CROSS-REFERENCE TO RELATED APPLICATIONS

This application is a continuation of U.S. application Ser. No. 12/788,090, filed May 26, 2010, which is a continuation of U.S. application Ser. No. 11/910,174, filed Sep. 28, 2007, now U.S. Pat. No. 7,745,844, issued Jun. 29, 2010, which is the U.S. national stage application of International Patent Application No. PCT/KR2007/001020, filed Feb. 28, 2007, which claims priority to Korean Patent Application No. 10-2006-0020305, filed Mar. 3, 2006, all of which are incorporated herein by reference in their entirety.

TECHNICAL FIELD

The embodiment of the present invention relates to a light-emitting diode (LED) package and a manufacturing method thereof.

BACKGROUND ART

An LED package includes an LED and a printed circuit board (PCB) for applying a driving signal to the LED and supporting the LED.

The LED is a device for converting electrical energy into light. Heat is generated while the electrical energy is converted into light. The above generated heat reduces a driving characteristic of the LED.

Therefore, the heat generated at the LED needs to be effectively suck.

Meanwhile, an LED package may attach a heatsink member to a PCB to allow heat generated at the LED to be swiftly sunk.

However, in the case where the heatsink member is attached, a process is complicated and costs increase.

Also, light emitted from the LED is blocked depending on an attaching position of the heatsink member, so that light emitting efficiency of an LED chip is reduced.

DETAILED DISCLOSURE

Technical Problem

An embodiment of the present invention provides an LED package and a manufacturing method, allowing heat generated from an LED chip to be effectively sunk.

An embodiment of the present invention provides an LED package and a manufacturing method, capable of preventing light emitting efficiency from being reduced while allowing heat generated from an LED chip to be effectively sunk.

Technical Solution

An embodiment of the present invention provides a light-emitting diode package comprising: a metal plate having grooves; an insulating layer on the metal plate; circuit patterns on the insulating layer; and a light-emitting diode electrically connected with the circuit pattern on the insulating layer.

An embodiment of the present invention provides a method for manufacturing a light-emitting diode package, the method comprising: preparing a metal core printed circuit board; selectively removing a metal plate contained in the metal core printed circuit board to form grooves; and mounting a light-emitting diode on the metal core printed circuit board.

An embodiment of the present invention provides an apparatus comprising: a metal plate having grooves; an insulating layer on a metal plate; a circuit pattern on the insulating layer; and an electronic device electrically connected with the circuit pattern on the insulating layer.

Advantageous Effects

An LED package according to an embodiment of the present invention can allow heat to be effectively sunk.

An LED package according to an embodiment of the present invention can allow heat to be effectively sunk without reducing light emitting efficiency of an LED chip.

MODE FOR INVENTION

Reference will now be made in detail to the preferred embodiments of the present invention, examples of which are illustrated in the accompanying drawings. It will also be understood that when an element is referred to as being "on/under" another element, it can be directly on the other element, or intervening elements may also be present.

Figure 1:
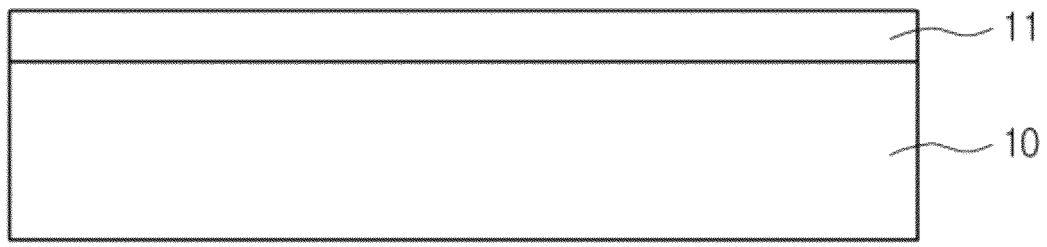
FIGS. 1 to 4 are views explaining a method for manufacturing an LED package according to first embodiment of the present invention.
Figure 2:
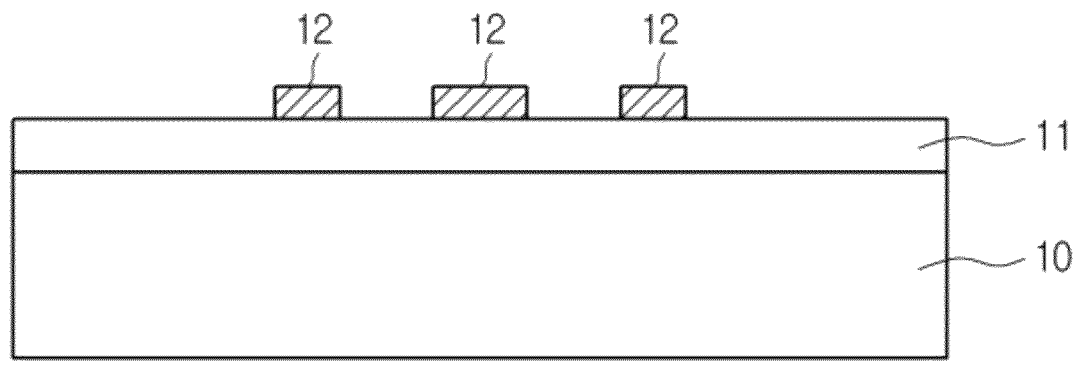

FIGS. 1 to 4 are views explaining a method for manufacturing an LED package according to first embodiment of the present invention. FIGS. 1 and 2 are views exemplarily illustrate a process for forming a metal core printed circuit board (MCPCB).

A method for maximizing a heatsink effect of the MCPCB will be described according to an embodiment of the present invention.

Referring to FIG. 1, an insulating layer 11 is formed on a metal plate 10.

The insulating layer 11 can be a resin layer. FR4 resin layer, which is a glass epoxy-based material, can be used as the resin layer, for example.

The metal plate 10 is formed to have thickness of several to several ten millimeters using metal such as Al and Au having excellent thermal conductivity, and serves as a heatsink.

The insulating layer 11 is formed using an FR4 resin layer having high mechanical strength and excellent durability, so that it is little deformed by heat even when it has a thin thickness, and having adhesiveness, so that it is suitable for forming a layer.

Meanwhile, the insulating layer 11 can be formed on an upper surface of the metal plate 10 using a press or a thermal compressing jig. The insulating layer 11 can adhere on the metal plate 10 using heat applied by a press or the thermal compressing jig.

Referring to FIG. 2, circuit patterns 12 are formed on the insulating layer 11.

The circuit patterns 12 are formed of metal such as Cu. The circuit patterns 12 can be formed using process technology for forming a semiconductor circuit, such as photolithography, metallization, and etching.

Through the above-process, an MCPCB where the circuit patterns 12 have been formed is prepared as illustrated in FIGS. 1 and 2.

Figure 3:
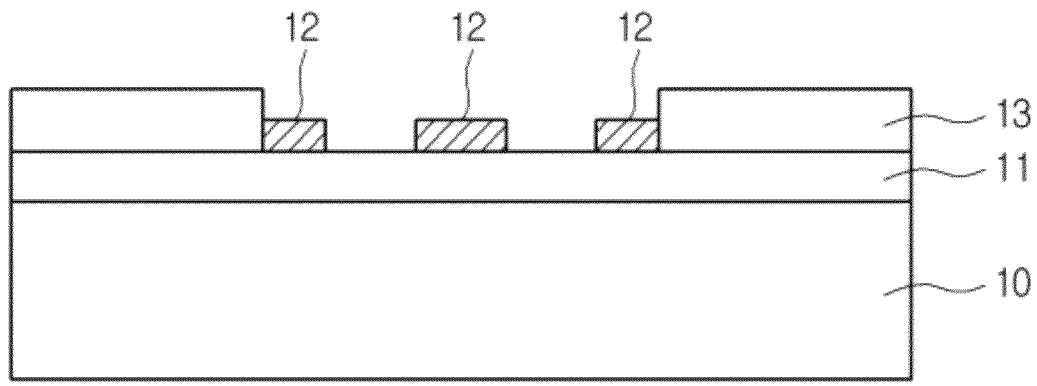

Referring to FIG. 3, a reflective layer 13 is selectively formed on the insulating layer 11.

The reflective layer 13 can be formed on a portion of the insulating layer 11 where the circuit patterns 12 have not been formed using a coating method.

The reflective layer 13 is designed for increasing brightness of light emitted from an LED chip, and appropriately formed on the portion of the insulating layer 11 with consideration of a region where the LED chip is mounted and a region where the circuit pattern 12 is formed.

The reflective layer 13 can be used a white resin formed by mixing $TiO_2$ and a resin as a primary component with at least one of $CaCO_3$, $BaSO_4$, and $ZnO$. Of course, the reflective layer 13 can be formed using white pigment besides the white resin.

Though the reflective layer 13 is not formed between the circuit patterns 12 in FIG. 3, the reflective layer 13 can be formed between the circuit patterns 12 depending on selection.

Screen printing, not dispensing, which uses air pressure is used to form the white resin in the form of the reflective layer 13.

The screen printing can coat the white resin over a large area for a relatively short period of time compared to the dispensing that uses air pressure, and requires low costs.

According to the screen printing, a screen mask having a thickness of 50 μm is formed on the circuit patterns 12, and portions that exclude the screen mask are filled with a white resin using a squeeze.

In detail, the squeeze moves in a predetermined direction along an upper surface of the screen mask while it rubs a liquid white resin, so that the portions that exclude the screen mask are filled with the liquid white resin.

The portions that exclude the screen mask are filled with the liquid white resin so that a surface of the white resin become planarized to be equal to an upper surface of the screen mask. Also, the screen mask is removed, and annealing is performed at a predetermined temperature to cure the white resin.

Figure 4:
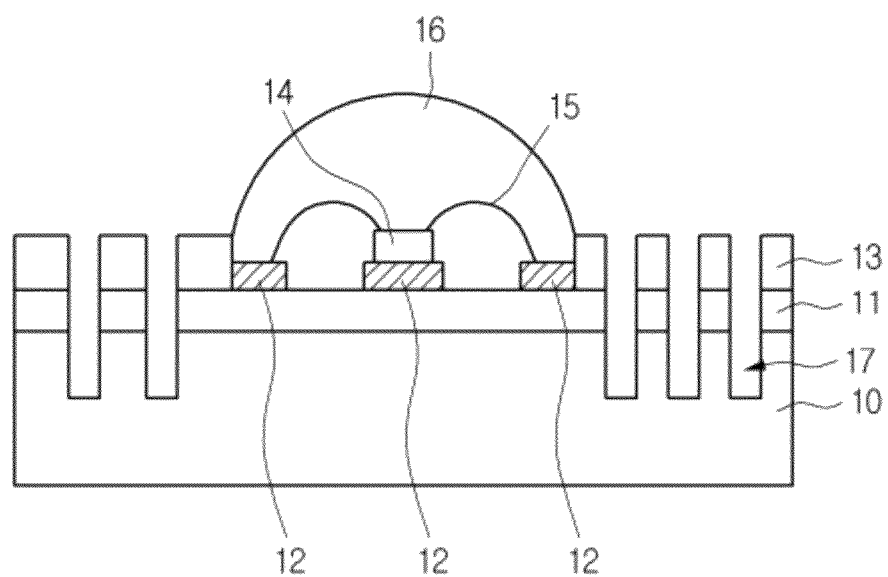

Referring to FIG. 4, after the reflective layer 13 formed of the white resin is formed, an LED chip 14 is mounted on the MCPCB.

In detail, the LED chip 14 is mounted on the circuit pattern 12, and the LED chip 14 is electrically connected to the circuit patterns 12 using wires 15. Also, a molding portion 16 is formed to cover the LED chip 14 and the wires 15.

The LED chip 14 can be formed on the insulating layer 11 or the reflective layer 13.

Meanwhile, the LED chip 14 can be mounted on a silicon optical bench (SiOB) through flip-bonding. The SiOB on which the LED chip 14 has been mounted through flip-bonding is mounted on the insulating layer 11 using paste having thermal conductivity, so that the LED chip 14 can be electrically connected to the circuit patterns 12 using lead frames.

After the LED chip 14 is mounted on the MCPCB, the metal plate 10, the insulating layer 11, and the reflective layer 13 are selectively removed to form a plurality of grooves 17 in an upper surface of the metal plate 10.

Since portions of the insulating layer 11 and the reflective layer 13 are removed from the upper surface of the groove 17, bottom surfaces and lateral sides of the grooves 17 are exposed to air. Therefore, heatsink effect of the metal plate 10 can be maximized.

Meanwhile, the LED chip 14 may be mounted on the MCPCB after the grooves 17 are formed.

Here, the plurality of grooves 17 can be formed through a mechanical method using a drilling machine or a milling machine, or a chemical method using etching.

Therefore, according to an LED package of the above embodiment, a surface area of the metal plate 10 required for heatsink is widened by the plurality of grooves 17, so that heat generated from the LED chip 14 can be effectively sunk. Therefore, thermal reliability of the LED chip 14 can be improved and thus performance of the LED chip 14 can be improved.

Figure 5:
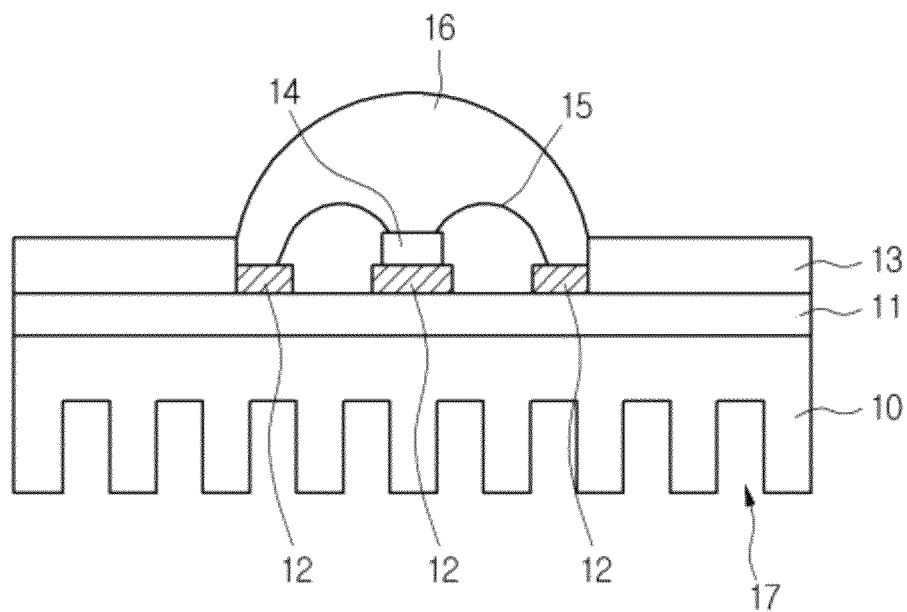
FIG. 5 is a view explaining an LED package according to second embodiment of the present invention.

FIG. 5 is a view explaining an LED package according to second embodiment of the present invention.

Unlike the LED package of FIG. 4, the LED package illustrated in FIG. 5 provides a plurality of grooves 17 formed in a lower surface of the metal plate.

Therefore, an area on which the reflective layer 13 has been formed increases, so that light efficiency can be improved even more and the number of the grooves 17 increases to maximize a heatsink effect.

Figure 6:
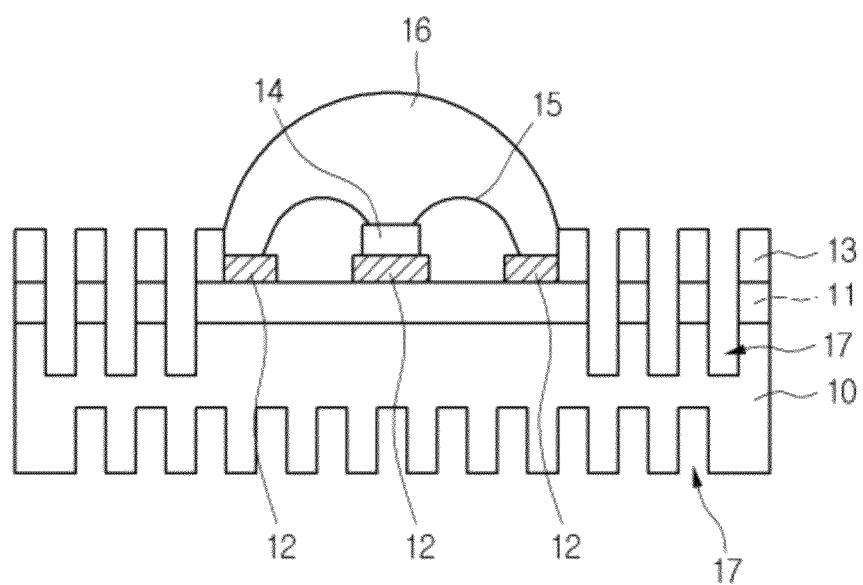
FIG. 6 is a view explaining an LED package according to third embodiment of the present invention.

FIG. 6 is a view explaining an LED package according to third embodiment of the present invention.

Unlike the LED package of FIGS. 4 and 5, the LED package illustrated in FIG. 6 provides a plurality of grooves 17 formed in an upper surface and a lower surface of the metal plate 10.

Therefore, a heatsink effect by the plurality of grooves 17 can be maximized.

Meanwhile, the grooves 17 in the upper surface of the metal plate 10 and the grooves 17 in the lower surface of the metal plate 10 are formed such that their positions are different from each other. That is, the groove 17 is not formed in a lower portion of the groove 17 formed in the upper surface of the metal plate, and the groove 17 is formed in a lower portion of the upper surface of the metal plate where groove 17 has not been formed.

In other words, the groove 17 formed in the upper surface of the metal plate, and the groove 17 formed in the lower surface of the metal plate are not located on the same line.

Accordingly, mechanical strength of the metal plate 10 can be maintained.

Though description has been made for an embodiment where an LED package on which the LED chip has been mounted, the present invention can be applied to an MCPCB on which various electronic devices such as an integrated circuit (IC) and a resistor are mounted.

INDUSTRIAL APPLICABILITY

The embodiment of the present invention can be applied to a circuit board on which electronic devices have been mounted.

It will be apparent to those skilled in the art that various modifications and variations can be made in the present invention. Thus, it is intended that the present invention covers the modifications and variations of this invention provided they come within the scope of the appended claims and their equivalents.

What is claimed is:
1. A light emitting diode package, comprising:
a metal layer having a top surface and a bottom surface, the top surface comprising a first portion having a planar surface and a second portion around the first portion;
a light emitting diode chip on the first portion of the metal layer;

a reflective layer on both the first portion and the second portion of the metal layer; and an optical member disposed on the metal layer and covering the light emitting diode chip, wherein at least one groove is formed on the second portion of the metal layer;

wherein a lower portion of the metal layer comprises at least one surface having different height from the bottom surface of the metal layer;

wherein the at least one groove is not vertically overlapped with the first portion having the planar surface; and wherein no light emitting diode chip is present in the at least one groove.

2. The light emitting diode package according to claim 1, wherein the groove is substantially symmetric with reference to the light emitting diode chip.

3. The light emitting diode package according to claim 1, wherein the bottom surface of the metal layer is undulating.

4. The light emitting diode package according to claim 1, further comprising a circuit on the metal layer.

5. The light emitting diode package according to claim 4, wherein the circuit is disposed on the first portion of the metal layer.

6. The light emitting diode package according to claim 1, further comprising an insulating layer on the metal layer.

7. The light emitting diode package according to claim 6, wherein the reflective layer is disposed on the insulating layer.

8. The light emitting diode package according to claim 1, wherein the reflective layer comprises a white resin formed by mixing $TiO_2$ and a resin as a primary component with at least one of $CaCO_3$, $BaSO_4$, and $ZnO$.

9. The light emitting diode package according to claim 1, wherein a top surface of the reflective layer is lower than a top surface of the light emitting diode chip.

10. The light emitting diode package according to claim 1, wherein a top surface of the first portion of the metal layer has substantially the same height as a top surface of the second portion of the metal layer.

11. The light emitting diode package according to claim 1, wherein the at least one groove is disposed between the first portion having the planar surface and the second portion around the first portion.

12. The light emitting diode package according to claim 1, wherein a topmost surface of the first portion having the planar surface is substantially flush with a topmost surface of the second portion around the first portion.

13. The light emitting diode package according to claim 1, wherein no groove is vertically overlapped with the first portion.

14. A light emitting device comprising a light emitting diode package, the light emitting diode package comprising:

a metal layer having a first portion of an upper surface and a second portion of the upper surface around the first portion, the first portion having a surface with a substantially flat portion;

a light emitting diode chip on the first portion of the metal layer;

a reflective layer on both the first portion and the second portion of the metal layer; and an optical member disposed on the metal layer and covering the light emitting diode chip, wherein at least one groove is formed on the second portion of the metal layer;

wherein a lower portion of the metal layer comprises at least one surface having different height from a bottom surface of the metal layer, wherein the at least one groove is not vertically overlapped with the first portion having a planar surface, and wherein no groove is vertically overlapped with the first portion.

15. The light emitting device according to claim 14, wherein the groove is substantially symmetric with reference to the light emitting diode chip.

16. The light emitting device according to claim 14, wherein the bottom surface of the metal layer is undulating.

17. The light emitting device according to claim 14, further comprising an insulating layer on the metal layer, wherein the reflective layer is disposed on the insulating layer.

18. The light emitting device according to claim 14, wherein a top surface of the first portion of the metal layer has substantially the same height as a top surface of the second portion of the metal layer.

19. The light emitting device according to claim 18, wherein a bottom surface of the at least one groove of the second portion is lower than the top surface of the second portion.

20. The light emitting device according to claim 14, wherein no light emitting diode chip is vertically overlapped with the at least one groove.

* * * * *